May 18, 1965 F. T. SPERA 3,184,532

ELECTRICAL COMPONENT AND METHOD OF ASSEMBLY

Filed March 1, 1963

INVENTOR.
FRANK T. SPERA
BY
Harry W. Hargis III
AGENT

United States Patent Office 3,184,532
Patented May 18, 1965

3,184,532

ELECTRICAL COMPONENT AND METHOD OF ASSEMBLY

Frank T. Spera, Philadelphia, Pa., assignor to Philco Corporation, Philadelphia, Pa., a corporation of Delaware Filed Mar. 1, 1963, Ser. No. 262,164
6 Claims. (Cl. 174—1)

This invention relates to electrical component assembly means, and more particularly to a method of and apparatus for securing components by means of their associated lead wires to panel-carried conductive wiring which may advantageously, although not necessarily, be of the etched or so-called "printed" type.

In attaching components to panels through the agency of their lead wires, the lead wires first are inserted through apertures that extend through both the insulating panel, and the conductive strips which define the circuit, and thence over surface regions of the panel. The wires are then cut to the desired lengths, and bent toward the conductive strips. Following this operation, and in order permanently to attach a component to the panel, the lead wires are soldered, by known means, to the conductive strips. There have evolved certain electronic components of such small size, and having so many leads, that it has become increasingly difficult to assemble the same into the desired printed wiring circuits. For example, the lead wires of certain components have diameters of the order of .016", and, because of the flexibility of such small diameter wire, assembly of a component to a printed wiring panel presents substantial difficulties.

It is therefore an objective of this invention to provide improved method and means for mounting relatively small electrical components upon a panel, through the agency of relatively thin lead wires extending from the components.

It is still another object of the invention to provide novel means effective to facilitate rigid attachment of small electrical components upon printed wiring panels.

A further object of the invention is to provide novel means for maintaining alignment of relatively thin, flexible component lead wires in the course of mounting a component on a panel by means of its lead wires.

In the accomplishment of the foregoing as well as other objectives, preferred practice of the invention contemplates provision of mounting means comprising a flexible and resilient, hollow, generally cylindrical element having peripheral, longitudinally extending outwardly presented grooves within which are disposed the lead wires of a component to be mounted. According to the invention, the cylindrical element, with component lead wires disposed within the grooves, is inserted into a generally circular opening provided in a printed wiring panel. The wires are thereby positioned in close adjacency to suitably presented printed wiring terminals on the printed wiring panel. Anvil means of suitable, usually flared, shape is then inserted forcibly into the bore of the flexible and resilient cylindrical element whereby to flex the latter radially outwardly against the lead wires and permanently to bend the wires toward the printed wiring terminals. The cylindrical element may or may not then be removed, and both permanent mounting and electrical connection of the component are effected by soldering the bent lead wires to terminal portions of the printed wiring.

For a more detailed understanding of the manner in which the objects and advantages of the invention may best be achieved, reference may be had to the following description taken in conjunction with the accompanying drawing, in which.

Figures 1, 2, 3, 4, 5, 6, 7, 8, 9, 10, 11:
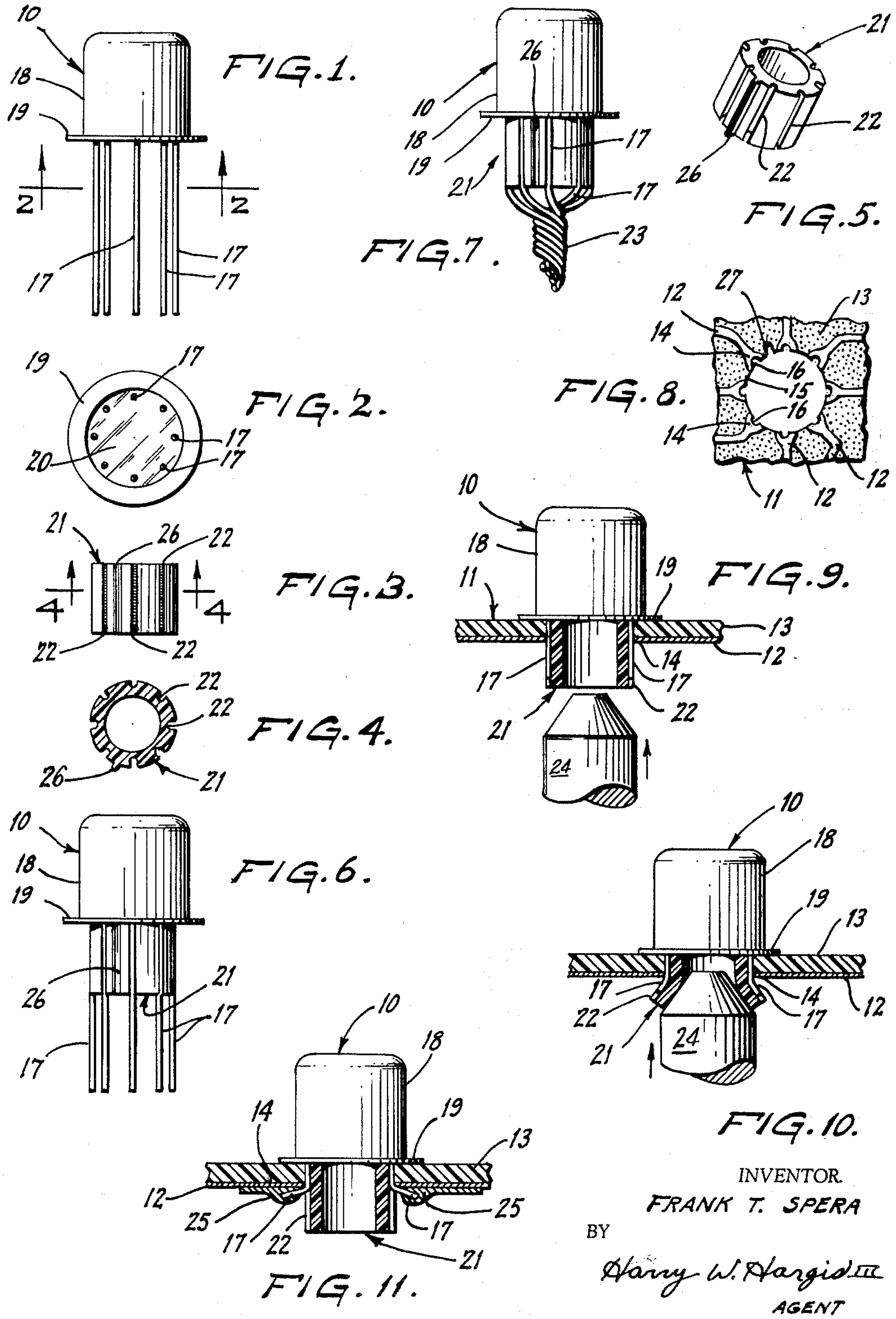
FIGURE 1 is an elevational view, on a greatly enlarged scale, showing a component adapted for mounting in accordance with principles of this invention.
FIGURE 2 is a view, partly in section, looking in the direction of arrows 2—2 applied to FIGURE 1.
FIGURE 3 is an elevational showing of component mounting means in accordance with the invention.
FIGURE 4 is a sectional view of the mounting means, looking in the direction of arrows 4—4 applied to FIGURE 3.
FIGURE 5 is a perspective showing of the mounting means illustrated in FIGURES 3 and 4.
FIGURE 6 is an elevational showing of the component and the mounting means in one of the assembly stages preparatory to mounting the component upon a wiring panel.
FIGURE 7 is a showing similar to that of FIGURE 6, but with the lead wires twisted upon one another to maintain assembly of the mounting means and the component, in further preparation for mounting of the assembly upon a wiring panel.
FIGURE 8 is a fragmentary bottom view of a printed wiring panel adapted for mounting thereon of the assembly illustrated in FIGURE 7.
FIGURES 9 and 10 are elevational showings of stages in the mounting of a component and its mounting means upon a printed wiring panel.
FIGURE 11 shows a component completely mounted upon a printed wiring panel.

With more detailed reference to the drawing, and first to FIGURES 1 and 2, there is illustrated, by way of example, a micro-module device 10 of known type adapted for attachment to a printed wiring panel by novel mounting means hereinafter to be more fully described. One example of a printed wiring panel is illustrated in fragmentary form in FIGURE 8, and is designated by the numeral 11. The panel 11 includes printed circuit elements 12 adherent to and extending over surface regions of an insulative board 13. Circuit elements 12 have terminal means 14 including portions disposed along the periphery of a generally circular aperture 15 extending through the panel, and each means 14 and the adjacent portion of board 13 includes a notch or recess 16 adapted to receive a lead wire 17 of device 10, as hereinafter will be more fully described.

The device 10 comprises a generally cylindrical, metallic housing 18 suitably welded along a radially presented flange 19 which has been press-formed with a like flange (not shown) provided on a component base portion disposed within the housing. The base portion terminates in an insulative sealing material, such as glass 20, and lead wires 17 extend through the glass from electrical apparatus (not shown) contained within housing 18. The lead wires extend unidirectionally and generally parallel to the major axis of the housing, and are adapted to provide both electrical contact and mechanical attachment means for the device.

With reference to FIGURES 3 to 7, a hollow, generally cylindrical mounting means, or element 21, is fabricated from an electrically non-conductive, flexible and resilient material, such as a nylon-type material for example, and has longitudinally extending, outwardly presented grooves 22 within which may be disposed lead wires 17 of a device 10 to be mounted.

In making the assembly, and with reference to FIGURES 6 and 7, lead wires 17 are disposed within the grooves 22 of cylinder 21, as illustrated in FIGURE 6, with housing 18 disposed adjacent the flat end portion of mounting element 21. The free ends of wires 17 are then twisted about an axis common with the axis of the housing 18 from which they extend, as illustrated in FIGURE 7, which axis also is common to the element 21. With the wires 17 twisted as shown at 23 in FIGURE 7, element 21 and housing 18 are capable of being handled as a unit, and are adapted for handling either by hand or by automatic machinery for insertion into aperture 15 provided in printed wiring panel 11.

As described earlier, each of the terminal means 14 is disposed adjacent the periphery of aperture 15, and notches 16 formed along the periphery of the aperture are so presented as to receive lead wires 17 upon insertion of the assembly into the aperture, as illustrated in FIGURE 9 of the drawing. Preferably, the wires 17 are so presented that, upon insertion, they forcibly engage the terminal portions 14 of circuits 12. This condition can be readily achieved by predetermining the depth of grooves 22 to a value for which the wires project slightly outwardly from the surface portion defined by the "lands" between said grooves 22. In order that proper predetermined orientation of the lead wires may be maintained as respects the terminal means, a rib is provided on the outer surface of base element 21 and adapted for seating within notch 27 formed in the portion of the board defining aperture 15 (FIGURE 8).

Following insertion of the assembly, the wires are trimmed, by suitable wire cutting means, substantially to the length shown in FIGURE 9. A flaring tool or anvil comprising a metal member 24, having the general shape of a truncated cone, is inserted into the lower, open end of the insulative cylinder 21 and is forcibly moved upwardly against the latter. By moving the flaring tool upwardly in this manner, cylinder 21 is flared outwardly permanently to bend lead wires 17 toward terminal portions 14 of circuit elements 12 on the bottom of the panel. The upward force is prevented from unseating the component and base from the aperture by virtue of frictional interengagement between the base and wires with the edges of the aperture. If desired, however, suitable auxiliary clamping means may be utilized to maintain the assembly upon insertion of the flaring tool.

Following the bending operation, in which the wires preferably are bent to the position illustrated in FIGURE 11, flaring tool 24 is removed, the flexible and resilient cylinder 21 returns to its original form, and may or may not be removed. Molten solder 25 is then disposed between the bent lead wires 17 and the printed wiring terminals 14 by known solder bonding techniques to complete the assembly of component 10 to the printed wiring panel 11.

The invention is particularly featured by provision of means for effecting less than a full 90° bend of the lead wire, in order that solder deposition can be concentrated between the printed wiring panel terminal portions and free end portions of the lead wires. Solder attachment in this manner affords, among other advantages, readily defined test point means as well as a thermal mass effective to protect the printed circuit terminal portions in the event heat need be applied thereto to melt the solder to remove the component.

It is to be understood that, although a preferred embodiment of the invention comprises generally cylindrical component and base elements, it is contemplated that various modifications in the shape and nature of the component and the base may be resorted to. Also, the term "printed wiring" should be understood to have a broad connotation, without limitation as respects the method by which the circuitry is applied to the panel. However, it will be recognized that the invention contemplates such modifications as come within the scope of the appended claims.

I claim:

1. An electrical component assembly adapted for mounting by insertion into an aperture in a wiring panel, said assembly comprising: a component having a plurality of lead wires extending generally unidirectionally therefrom; mounting means having a centrally disposed opening and made of flexible and resilient, electrically insulative material having outwardly presented, longitudinally extending grooves in peripheral portions thereof and within which grooves said lead wires are disposed, an open central portion of said mounting means being presented away from said component, and free ends of said lead wires being twisted upon one another about an axis generally concentric with the axis of said insulative mounting means, whereby to maintain said wires within said grooves and to maintain said mounting means attached to said component.

2. An assembly according to claim 1 and characterized in that each said component and said mounting means have the configuration of a cylinder.

3. The assembly according to claim 2 and further characterized in that said mounting means comprises a hollow cylinder.

4. An electrical component assembly adapted for mounting by insertion into an aperture in a printed wiring panel, said assembly comprising: a component having a plurality of lead wires extending unidirectionally therefrom; and a hollow element of flexible and resilient, electrically insulative material having outwardly presented longitudinally extending grooves in peripheral portions thereof and within which said lead wires are disposed, free ends of said lead wires being twisted on one another about an axis generally concentric with the axis of said element, whereby to maintain said wires within said grooves and to maintain said element attached to said component.

5. In a method of mounting an electrical component assembly by forcible insertion into an aperture in a printed wiring panel having wiring terminals adjacent the aperture, said assembly having a plurality of lead wires extending unidirectionally therefrom and a tubular element of flexible and resilient, electrically insulative material having radially presented longitudinally extending grooves in peripheral portions thereof and within which said lead wires are disposed, end portions of said lead wires being displaced in such manner as to maintain said wires within said grooves and to maintain said tubular element attached to said component, the steps comprising: inserting said tubular element into said aperture for attachment of the leads to said wiring terminals; severing said end portions of said lead wires from portions of the wires disposed within said grooves; flaring said tubular element outwardly against said lead wires whereby permanently to bend the lead wires toward said printed wiring terminals; permitting said tubular element resiliently to return to its non-flared, rest position; and solder bonding said bent lead wires to said printed wiring terminals.

6. In a method of mounting an electrical component assembly by forcible insertion into an aperture in a printed wiring panel having wiring terminals adjacent the apertures, said assembly having a plurality of lead wires including unidirectionally presented portions, and a tubular element of flexible and resilient, electrically insulative material having radially presented longitudinally extending grooves in peripheral portions thereof, and within which said lead wire portions are retained to maintain said tubular element attached to said component, the steps comprising: inserting said tubular element into said aperture for attachment of the leads to the wiring terminals; flaring said tubular element outwardly against said unidirectionally extending lead wire portions whereby permanently to bend said lead wire portions toward said printed wiring terminals; permitting the tubular element resiliently to return to its non-flared, rest position; and solder bonding said bent lead wire portions to said printed wiring terminals.

References Cited by the Examiner

UNITED STATES PATENTS

| | | | |
|---|---|---|---|
| 2,881,405 | 4/59 | Yarbrough | 339—132 X |
| 2,904,617 | 9/59 | King | 174—138 X |
| 2,966,618 | 12/60 | Lehner | 174—68.5 X |
| 3,046,452 | 7/62 | Gillert | 174—52 X |
| 3,122,685 | 2/64 | Krysmanski | 174—52 X |

JOHN F. BURNS, *Primary Examiner.*

JOHN P. WILDMAN, *Examiner.*